United States Patent
Isao et al.

(10) Patent No.: US 6,569,577 B1
(45) Date of Patent: May 27, 2003

(54) PHASE-SHIFT PHOTO MASK BLANK, PHASE-SHIFT PHOTO MASK AND METHOD FOR FABRICATING SEMICONDUCTOR DEVICES

(75) Inventors: Akihiko Isao, Saitama-ken (JP); Susumu Kawada, Saitama-ken (JP); Shuichiro Kanai, Saitama-ken (JP); Nobuyuki Yoshioka, Hyogo-ken (JP); Kazuyuki Maetoko, Hyogo-ken (JP)

(73) Assignees: Ulvac Coating Corporation, Saitama (JP); Mitsubishi Denki Kabushiki Kaisha, Tokyo (JP)

( * ) Notice: Subject to any disclaimer, the term of this patent is extended or adjusted under 35 U.S.C. 154(b) by 41 days.

(21) Appl. No.: 09/704,697

(22) Filed: Nov. 3, 2000

(30) Foreign Application Priority Data

Nov. 9, 1999 (JP) .......................... 11-318177
Aug. 10, 2000 (JP) .......................... 2000-243103

(51) Int. Cl.$^7$ ........................................... G03F 9/00
(52) U.S. Cl. ........................................... 430/5; 378/35
(58) Field of Search ................ 430/5, 322; 378/35; 428/426, 428

(56) References Cited

U.S. PATENT DOCUMENTS 5,472,811 A * 12/1995 Vasudev et al. ............ 430/5
5,789,116 A * 8/1998 Kim ......................... 430/5

FOREIGN PATENT DOCUMENTS

| JP | 6-220627 | 8/1994 |
| JP | 7-140635 | 6/1995 |
| JP | 8-74031 | 3/1996 |
| JP | 8-127870 | 5/1996 |

* cited by examiner

Primary Examiner—S. Rosasco
(74) Attorney, Agent, or Firm—Arent Fox Kintner Plotkin & Kahn, PLLC

(57) ABSTRACT

A phase-shift photo mask blank comprises a half tone phase-shift film, wherein the half tone phase-shift film consists of at least two layers and in the case of two layers, the refractive index of the upper layer of the film is smaller than that of the lower layer thereof; in the case of three layers, the refractive index of the intermediate layer is smaller than those observed for the upper and lower layers or the refractive index of the upper layer is smaller than that of an intermediate layer; in the case of at least 4 layers, the refractive index of the upper most layer is smaller than that of the layer immediately below the upper most layer. The photo mask blank permits the production of a phase-shift photo mask having a high transmittance at an exposure wavelength and a low reflectance as well as a low transmittance at a defect-inspection wavelength. The photo mask in turn permits the fabrication of a semiconductor device having a fine pattern.

17 Claims, 4 Drawing Sheets

PHASE-SHIFT PHOTO MASK BLANK, PHASE-SHIFT PHOTO MASK AND METHOD FOR FABRICATING SEMICONDUCTOR DEVICES

BACKGROUND OF THE INVENTION

The present invention relates to a phase-shift photo mask blank consisting of a multilayered phase-shift film and a phase-shift photo mask as well as a method for the fabrication of a semiconductor device using the mask. More specifically, the present invention pertains to an attenuation type (half tone) phase-shift photo mask and phase-shift photo mask blank for use in the production of the photo mask as well as a method for the fabrication of a semiconductor device using the mask.

There have conventionally been proposed, as attenuation type phase-shift photo masks, those comprising single-layered films (see, for instance, Japanese Un-Examined Patent Publication No. Hei 7-140635) and those comprising double-layered films (see, for instance, Japanese Un-Examined Patent Publication No. Hei 8-74031). The film structure of an attenuation type phase-shift photo mask comprising a single-layered film is shown in FIG. 1 and that of the photo mask comprising a double-layered film is shown in FIG. 2.

Patterns of semiconductor integrated circuits have increasingly been finer as the recent development of the technique for the fabrication of a semiconductor integrated circuit and this in turn leads to the reduction of the wavelength of light rays used for exposure. For this reason, the following characteristic properties have been required for the attenuation type phase-shift photo mask, which attenuates the intensity of exposed light rays having a desired wavelength:

(1) The phase difference (PS) should satisfy the following relation: PS=175 to 180 degrees;
(2) The transmittance ($T_{exp}$) at the wavelength ($\lambda_{exp}$) of the exposed light rays should satisfy the following relation: $T_{exp}$=2 to 30%;
(3) The transmittance ($T_{insp}$) at the inspection wavelength ($\lambda_{insp}$) should satisfy the following relation: $T_{insp}$<about 40 to 50% (for instance, $\lambda_{insp}$=365 nm when $\lambda_{exp}$=193 nm);
(4) The reflectance ($R_{exp}$) at the exposure wavelength should preferably satisfy the following relation: $R_{exp}$<about 20%; and
(5) The film thickness d is preferably thin.

If the exposure wavelength ($\lambda_{exp}$) is reduced (for instance, $\lambda_{exp}$=193 nm for the exposure using an ArF excimer laser) in the case of the foregoing conventional phase-shift film, the transmittance ($T_{exp}$) at the exposure wavelength ($\lambda_{exp}$) is lower than the foregoing required transmittance. For this reason, if the transmittance ($T_{exp}$) is increased in order to ensure the required transmittance at the exposure wavelength, the transmittance at the defect-inspection wavelength becomes extremely high. For instance, in the case of the double-layered film as shown in FIG. 2 and in the case of the foregoing conventional technique, the transmittance at the exposure wavelength is reduced since the refractive index of the upper film ($n_1-ik_1$), which comes in contact with the ambient environment such as air (refractive index: $n_o$) or other gases, is greater than that of the lower film ($n_2-ik_2$). As a result, any satisfactory transmittance at the wavelength of, for instance, an ArF excimer laser cannot be obtained. As shown in Tables 1 and 2, the transmittance of a phase-shift film tends to become higher as the wavelength becomes longer. On the other hand, if the transmittance at the exposure wavelength is increased, the transmittance at the defect-inspection wavelength (for instance, $\lambda_{insp}$=365 nm) for a conventional phase-shift photo mask becomes extremely high, making defect-inspection impossible. As previously discussed, the foregoing conventional techniques are not compatible with the recent development of the techniques for the fabrication of semiconductor integrated circuits. For example, among the basic structures $F_{11}$, $F_{13}$ in which the number of layer is one in Table 1, $F_{11}$, has a phase difference of about 180° at the exposure wavelength of 193 nm with the transmittance of 10.57%, which meets the requirements (1) and (2) described on page 1, line 26 to page 2, line 1. However, if the inspection wavelength is limited to 365 nm, the transmittance of the phase-shift film is 86.52%, which does not meet the requirements under (3) at page 2, lines 2–4. However, if the defect-inspection wavelength is 248 nm, the transmittance is 27.82% as shown for a single layer film $F_{11}$ in Table 1. Thus, when a defect inspection device is used at an inspection wavelength of 365 nm, there is a resultant large scale increase for the transmittance. This allows one to perform a further inspection with a second defect inspection device using a shorter defect-inspection wavelength.

In this connection, the wavelength used for inspection is likely to be reduced owing to the efforts of manufacturers of defect-inspection devices. Therefore, fewer problems should arise if the transmittance increases to an extent beyond an acceptable value for the defect-inspection wavelength (365 nm) by shortening the defect-inspection wavelength. Thus, it is likely that a new defect inspection device, which can use a considerably shorter wavelength than 365 nm, is achievable in the near future.

In summary, it is probable that the next generation of defect-inspection devices will allow for a slight increase in the transmittance at the defect-inspection wavelength of 365 nm. However, it seems less likely that a great increase in the transmittance can be achieved without being problematic for defect inspection.

SUMMARY OF THE INVENTION

Accordingly, it is an object of the present invention to provide a phase-shift photo mask, which can solve the foregoing problems associated with the conventional techniques, which can ensure a transmittance sufficient for shorter exposure wavelengths and therefore, permits the use of such a shorter exposure wavelength, and which has an appropriate transmittance for the defect-inspection wavelengths and thus permits the satisfactory inspection.

Another object of the present invention is to provide a phase-shift photo mask blank for use in making such a photo mask.

A further object of the present invention is to provide a method for fabricating a semiconductor device, which makes use of the photo mask.

The inventors of the present invention have conducted various studies to solve the foregoing problems associated with the conventional techniques, have found that the foregoing problems can effectively be solved by taking notice of the refractive indexes of films or layers and optimizing the structure of a multilayered phase-shift film and thus have completed the present invention.

According to an aspect of the present invention, there are provided phase-shift photo mask blanks, which comprises a half tone phase-shift film, wherein the half tone phase-shift film comprises two layers and the upper layer of the film has a refractive index smaller than that of the lower layer of the film. The photo mask blank permits the production of a phase-shift photo mask whose transmittance at the exposure wavelength is high and whose reflectance is low.

According to another aspect of the present invention, there are provided phase-shift photo mask blanks, which comprise a half tone phase-shift film, wherein the half tone phase-shift film comprises three layers and the refractive index of the intermediate layer of the film is smaller than those of the upper and lower layers of the film. Thus, the resulting phase-shift photo mask has a low transmittance at the defect-inspection wavelength and this in turn permits the inspection. In the case of the phase-shift film comprising three layers, the film may have, for instance, the following basic structure: air or other gases/$n_1$, $k_1$, $d_1$/$n_2$, $k_2$, $d_2$/$n_3$, $k_3$, $d_3$/transparent substrate (wherein $n_1$, $n_2$ and $n_3$ are refractive indexes of the upper, intermediate and lower layers, respectively; $k_1$, $k_2$ and $k_3$ are extinction coefficients of the upper, intermediate and lower layers, respectively; and $d_1$, $d_2$ and $d_3$ are thicknesses of the upper, intermediate and lower layers, respectively).

Moreover, if the half tone phase-shift film according to the present invention comprises three layers, it is also possible to reduce the refractive index of the upper layer of the film to a level smaller than that of the intermediate layer thereof. In this case, the photo mask blank also permits the production of a phase-shift photo mask whose transmittance at the exposure wavelength is high and whose reflectance is low.

The half tone phase-shift photo mask blank according to the present invention may further comprise a half tone phase-shift film comprising at least 4 layers, wherein the refractive index of the upper most layer of the film is smaller than that of the layer immediately below the upper most layer. Thus, the photo mask blank permits the production of a phase-shift photo mask whose transmittance at the exposure wavelength is high.

The half tone phase-shift film is an MoSiON type film. In addition, the phase-shift film may likewise be an MoSiN type or MoSiO type one.

The phase-shift photo mask according to the present invention comprises the foregoing phase-shift photo mask blank on which a pattern to be transferred to a wafer substrate is formed according to the usual method. A semiconductor device having a fine pattern can be fabricated by exposing a semiconductor wafer to light rays through the phase-shift photo mask.

Accordingly, the present invention further relates to a method for fabricating a semiconductor device having a fine pattern, which comprises the step of exposing a wafer substrate to light rays through a phase-shift photo mask produced from the foregoing phase-shift photo mask blank.

According to a further aspect of the present invention, there is also provided a method for fabricating a semiconductor device having a fine pattern, which comprises the step of exposing a wafer substrate to light rays through a phase-shift photo mask comprising a phase-shift photo mask blank selected from the group consisting of a double-layered half tone phase-shift film in which the refractive index of the upper layer is smaller than that of the lower layer, a three-layered half tone phase-shift film in which the refractive index of the intermediate layer is smaller than those of the upper and lower layers or the refractive index of the upper layer is smaller than that of the intermediate layer, or a multi-layered half tone phase-shift film comprising at least 4 layers in which the refractive index of the upper most layer is smaller than that of the layer immediately below the upper most layer, on which a pattern to be transferred to the wafer substrate is formed.

The step of exposing a wafer to light rays can be performed using an $F_2$ laser ($\lambda_{exp}$=157 nm), KrF excimer laser ($\lambda_{exp}$=248 nm), in addition to the ArF excimer laser ($\lambda_{exp}$=193 nm) already described above.

BRIEF DESCRIPTION OF THE DRAWINGS

The present invention will hereunder be described in more detail with reference to the accompanying drawings, wherein.

DESCRIPTION OF THE PREFERRED EMBODIMENTS

The present invention will be described in more detail with reference to the accompanying drawings, while also explaining conventional techniques by way of comparison. In the following embodiments, air ($n_0$=1) is used as an atmospheric gas.

Embodiment 1

In this embodiment, the optimization of the structure of double-layered and three-layered films according to the present invention will be described with reference to the accompanying drawings (FIGS. 1 to 5) while comparing with the conventional techniques.

Figure 1:
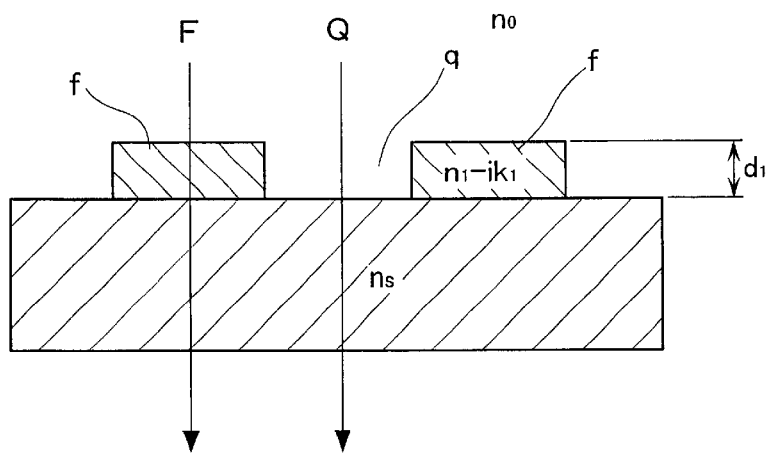
FIG. 1 is a cross sectional view showing a conventional phase-shift photo mask of attenuation type, which comprises a single layered phase-shift film.

In the case of a single-layered film as shown in FIG. 1, the phase difference (PS) between the light rays F transmitting through a phase-shift film f and the light rays Q transmitting through an opening q of the phase-shift film can be depicted by the following equation:

$$PS=2\pi(n_1-n_0)d_1/\lambda \quad (1)$$

In addition, the film thickness $d_1^0$ at which PS is equal to 180 degrees ($\pi$) is given by the following relation:

$$d_1^0=\lambda_{exp}/2(n_1-n_0) \quad (2)$$

In the foregoing equations, $n_1$ represents the refractive index of the phase-shift film, $n_0$ represents the refractive index of the air ($n_0$≅1), $d_1$ is the thickness of the phase-shift film and $\lambda_{exp}$ is an exposure wavelength.

Figure 2:
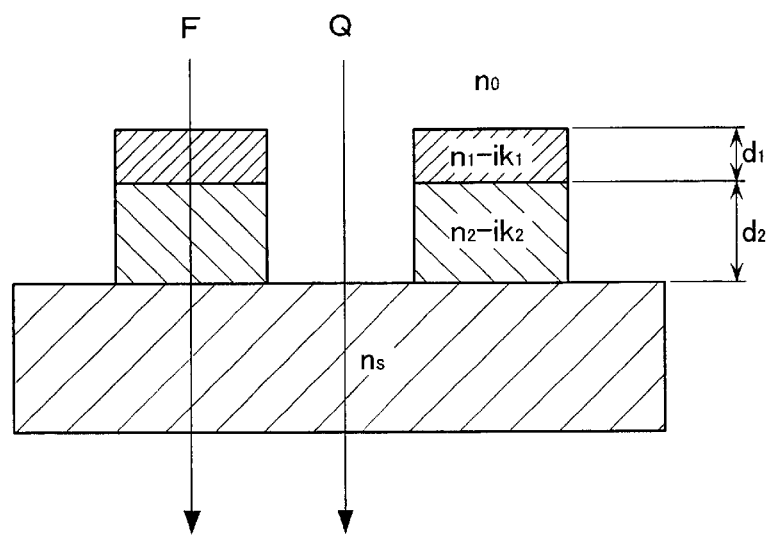
FIG. 2 is a cross sectional view showing a phase-shift photo mask of attenuation type, which comprises a double-layered phase-shift film.

In the case of the double-layered film as shown in FIG. 2, the phase difference (PS) between the light rays F transmitting through a phase-shift film and the light rays Q trans mitting through an opening of the phase-shift film can be depicted by the following equation:

$$PS=PS_1+PS_2 \quad (3)$$

wherein $PS_1$ and $PS_2$ are given by the following relations, respectively:

$$PS_1=2\pi(n_1-n_0)d_1/\lambda_{exp} \quad (4)$$

$$PS_2=2\pi(n_2-n_0)d_2/\lambda_{exp} \quad (5)$$

From the foregoing equations (3), (4) and (5), the requirement for satisfying the relation: $PS=\pi$ is as follows:

$$d_1/d_1^0+d_2/d_2^0=1 \quad (6)$$

wherein $d_1^0$ and $d_2^0$ are given by the following equations, respectively:

$$d_1^0=\lambda_{exp}/2(n_1-n_0) \quad (7)$$

$$d_2^0=\lambda_{exp}/2(n_2-n_0) \quad (8)$$

In the foregoing equations, $PS_1$ and $PS_2$ are phase differences of the upper and lower layers of the film, respectively; $n_1$ and $n_2$ are refractive indexes of the upper and lower layer of the film, respectively; $d_1$ and $d_2$ are the thicknesses of the upper and lower layers of the film, respectively; $d_1^0$ and $d_2^0$ are the thicknesses of the upper and lower layers of the film, respectively, at which the phase differences of the upper and lower layers are equal to 180 degrees, respectively; and $\lambda_{exp}$ is an exposure wavelength.

Figure 3:
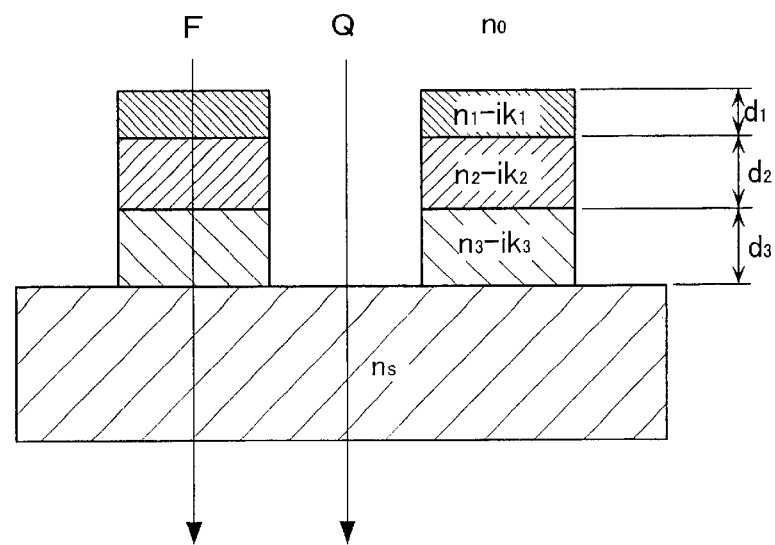
FIG. 3 is a cross sectional view showing a phase-shift photo mask of attenuation type, which comprises a three-layered phase-shift film.

In the case of the three-layered film as shown in FIG. 3, the phase difference (PS) between the light rays F transmitting through a phase-shift film and the light rays Q transmitting through an opening of the phase-shift film can be depicted by the following equation:

$$PS=PS_1+PS_2+PS_3 \quad (9)$$

wherein $PS_1$, $PS_2$ and $PS_3$ are given by the following relations, respectively:

$$PS_1=2\pi(n_1-n_0)d_1/\lambda_{exp} \quad (10)$$

$$PS_2=2\pi(n_2-n_0)d_2/\lambda_{exp} \quad (11)$$

$$PS_3=2\pi(n_3-n_0)d_3/\lambda_{exp} \quad (12)$$

From the foregoing equations (9) to (12), the requirement for satisfying the relation: $PS=\pi$ is as follows:

$$d_1/d_1^0+d_2/d_2^0+d_3/d_3^0=1 \quad (13)$$

wherein $d_1^0$, $d_2^0$ and $d_3^0$ are given by the following equations, respectively:

$$d_1^0=\lambda_{exp}/2(n_1-n_0) \quad (14)$$

$$d_2^0=\lambda_{exp}/2(n_2-n_0) \quad (15)$$

$$d_3^0=\lambda_{exp}/2(n_3-n_0) \quad (16)$$

In the foregoing equations, $PS_1$, $PS_2$ and $PS_3$ are phase differences of the upper, intermediate and lower layers of the film, respectively; $n_1$, $n_2$ and $n_3$ are the refractive indexes of the upper, intermediate and lower layers of the film, respectively; no is the refractive index of the air ($n_0=1$); $d_1$, $d_2$ and $d_3$ are the thicknesses of the upper, intermediate and lower layers of the film, respectively; $d_1^0$, $d_2^0$ and $d_3^0$ are the thicknesses of the upper, intermediate and lower layers of the film respectively, at which the phase differences of these layers are equal to 180 degrees, respectively; and $\lambda_{exp}$ is an exposure wavelength.

The symbol $n_s$ appearing on FIGS. 1 to 3 represents the refractive index of a substrate. The symbol $k_1$ appearing on FIG. 1 means the extinction coefficient of the upper layer of the phase-shift film. The symbols $k_1$ and $k_2$ appearing on FIG. 2 represent the extinction coefficients of the upper and lower layers of the film, respectively. Further, the symbols $k_1$, $k_2$ and $k_3$ appearing on FIG. 3 represent the extinction coefficients of the upper, intermediate and lower layers of the film, respectively.

In Tables 1 and 2 given below, RR represents the reflectance (relative reflectance) of a film relative to that observed for an aluminum vacuum-deposited film; PS0 means the phase difference of a film when disregarding any absorption by the film; and PS means the phase difference of a film when taking into consideration the absorption by the film.

There have thus been described conditions required for satisfying the phase difference (PS)=$\pi$, in the cases of single-layered, double-layered and three-layered films. Now we will explain hereunder the optimization of the structures of double-layered and three-layered films.

Figure 4:
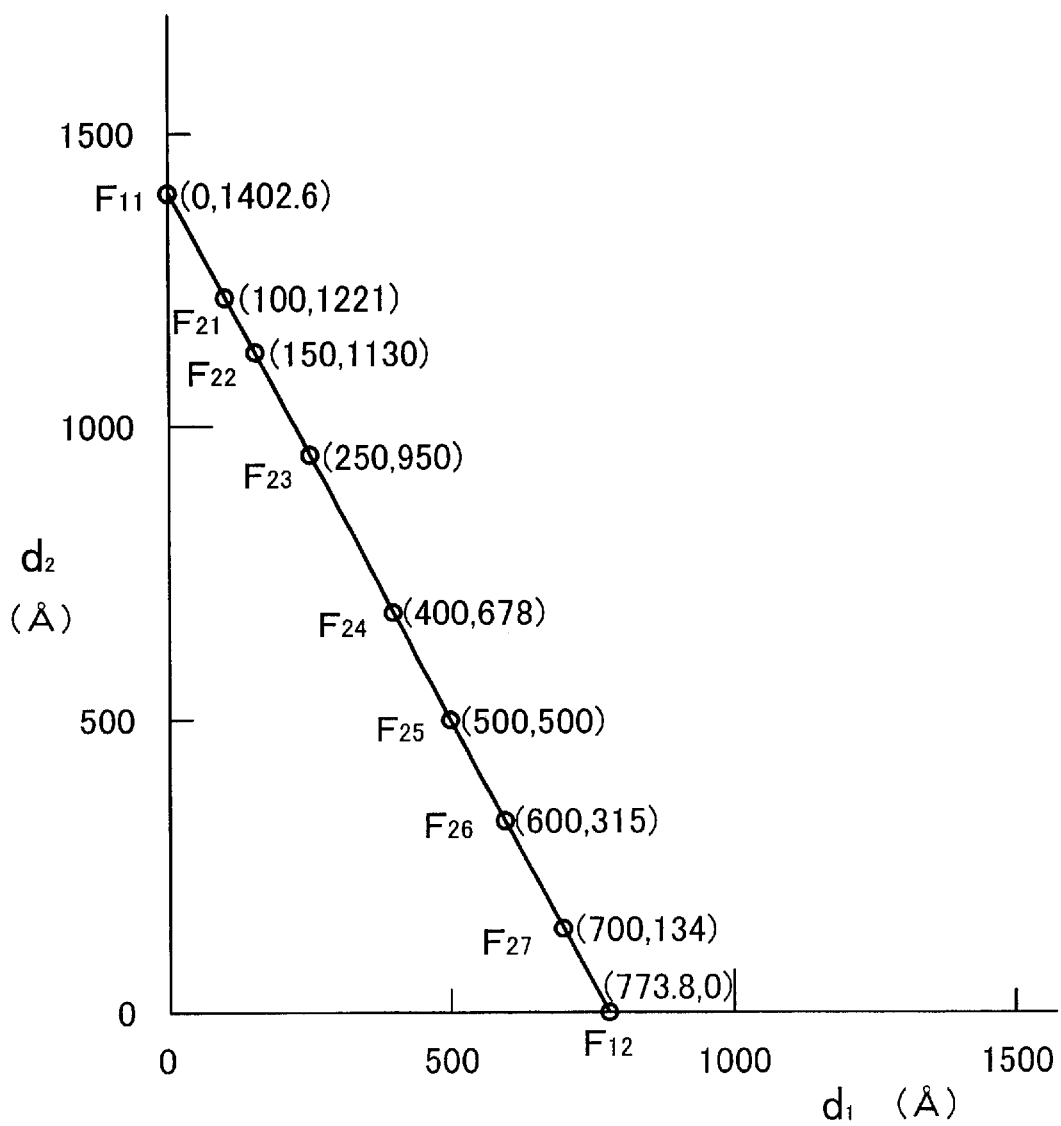
FIG. 4 is a graph showing the relation between the thicknesses ($d_1$, $d_2$) of the layers constituting a double-layered phase-shift film.

First, we will describe the optimization of a double-layered phase-shift film. The foregoing equation (6) indicates that there is a linear relation, as shown in FIG. 4, between the thicknesses (angstrom, Å) $d_1$ and $d_2$ of the respective layers constituting the phase-shift film, which gives a phase difference of $\pi$. Optical characteristic properties of the film at points $F_{11}$, $F_{12}$, $F_{21}$ to $F_{27}$ along the straight line are calculated and the results thus obtained are listed in the following Table 1. In this connection, values, shown in Table 4, observed for MoSiON sputter films (annealed at 350° C. for 3 hours), Q:11, Q:13 were used as optical constants of a phase-shift film. In Table 1, $f_1$ is a phase-shift film (a conventional film) having a structure in which the refractive index of the upper layer of the film is higher than that of the lower layer thereof. In addition, $f_2$ is a phase shift film (a film of the present invention) having a structure in which the refractive index of the upper layer of the film is lower than that of the lower layer thereof. The data listed in Table 1 clearly indicate that the transmittance $T_{193}$ of $f_2$ at an exposure wavelength of 193 nm is higher than that of $f_1$. In addition, the reflectance $RR_{193}$ of $f_2$ at an exposure wavelength of 193 nm is lower than that of $f_1$. This tendency is quite favorable for the phase-shift film.

Accordingly, a phase-shift film whose refractive index of the upper layer is smaller than that of the lower layer is superior to that whose refractive index of the upper layer is higher than that of the lower layer like the film $f_1$ (a conventional film).

Figure 5:
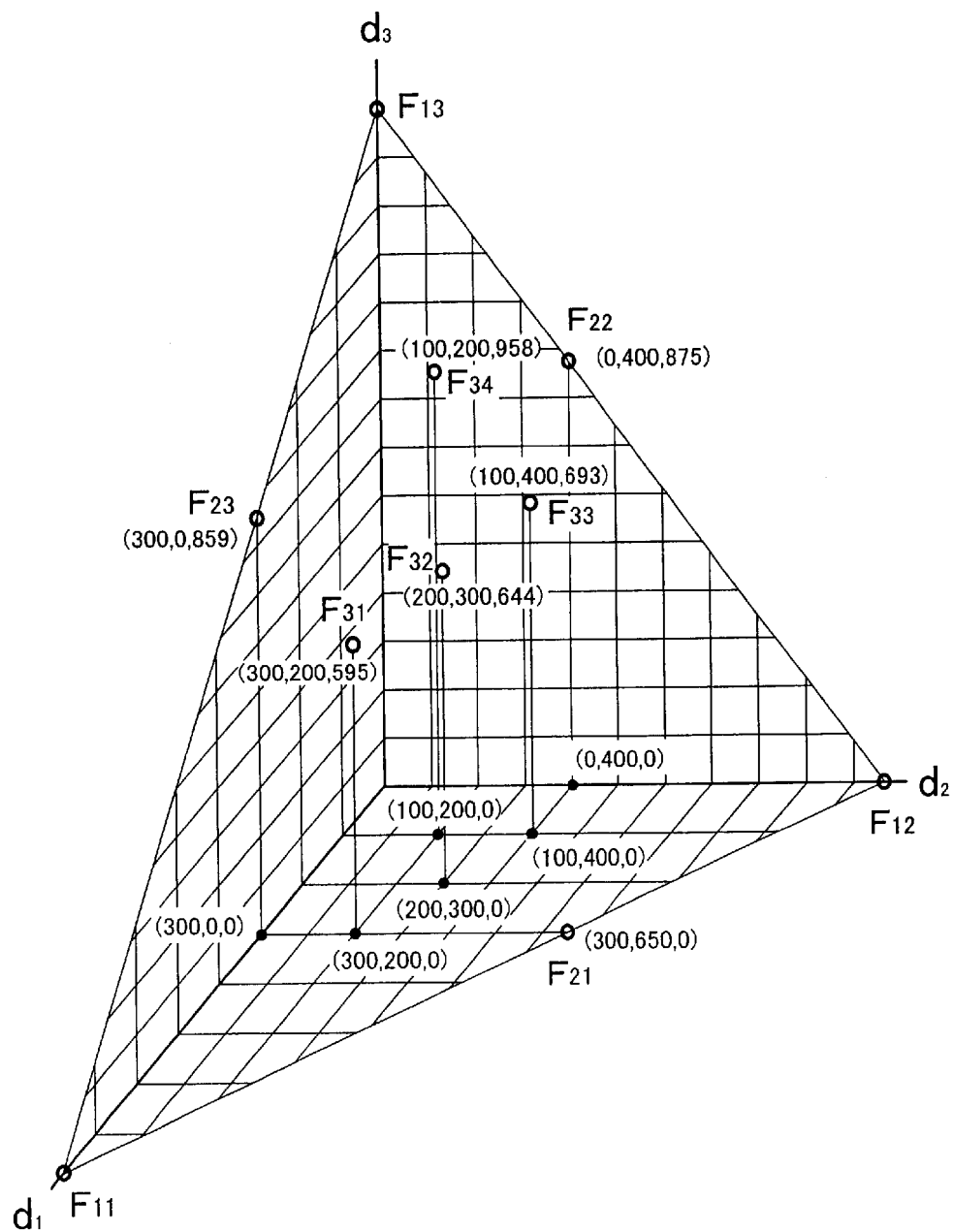
FIG. 5 is a graph showing the relation between the thicknesses ($d_1$, $d_2$, $d_3$) of the layers constituting a three-layered phase-shift film.

Then we will describe the optimization of the structure of the three-layered phase-shift film below. The thicknesses (angstrom, Å) $d_1$, $d_2$ and $d_3$ of the three layers of the three-layered phase-shift film, which can provide a phase difference of $\pi$ are given as points on a plane formed by three points $F_{11}$, $F_{12}$ and $F_{13}$ as shown in FIG. 5. The optical properties of the phase-shift film were determined at points $F_{31}$, $F_{32}$, $F_{33}$ and $F_{34}$ on the plane and the results thus obtained are summarized in the following Table 2. Table 2 also includes the optical properties calculated at points $F_{11}$, $F_{12}$ and $F_{13}$ for the single-layered phase-shift film and those calculated at points $F_{21}$, $F_{22}$ and $F_{23}$ for the double-layered phase-shift film by way of comparison. The details of the basic structure $F_{3j}$(j=1~4) and phase-shift films $f_1$ to $f_6$ listed in Table 2 are shown in Table 3. In this connection, values, shown in Table 4, observed for MoSiON sputter films, Q:11, Q:25, Q:13 were used as optical constants of a phase-shift film.

From the data listed in Table 2, we can deduce the following conclusions: among these films $f_1$ to $f_6$, films $f_2$, $f_4$ and $f_6$ have high transmittances $T_{193}$ at an exposure wavelength of 193 nm and the films $f_3$ and $f_5$ have low transmittances $T_{365}$ at a defect-inspection wavelength of 365 nm. Moreover, the reflectance $RR_{193}$ of the films $f_1$ and $f_3$ at an exposure wavelength of 193 nm are higher than those observed for the films $f_2$, $f_4$, $f_5$ and $f_6$.

Therefore, in order to increase the transmittance at an exposure wavelength in the case of a phase-shift film to be exposed to light rays of 193 nm, it is preferred to select the films $f_2$, $f_4$ and $f_6$ or it is preferred that the refractive index of the upper layer of the film is smaller than that of the intermediate layer thereof. Moreover, in order to reduce the transmittance at a defect-inspection wavelength, it is preferred to select the films $f_3$ and $f_5$ or it is preferred that the refractive index of the intermediate layer of the film is smaller than those of the upper and lower layers thereof.

In the foregoing embodiment, we have described the optimization of the structures of the double-layered and three-layered films. The structure of a multi-layered half tone phase-shift film comprising at least 4 layers may be optimized if the phase-shift film is designed in such a manner that the refractive index of the upper most layer of the film is smaller than that of the layer immediately below the upper most layer. Thus, a phase-shift film can be obtained, which has a high transmittance at an exposure wavelength, like those explained above.

TABLE 1

| Number of Layers | Basic Structure | Substituted Film | Overall Film Thickness Å | 193(nm) RR % | T % | PS ° | PS0 ° | 248 (nm) T % | 365 (nm) T % |
|---|---|---|---|---|---|---|---|---|---|
| 1 | $F_{11}$ | | 1402.6 | 8.33 | 10.57 | 178.7 | 180.0 | 27.82 | 86.52 |
|   | $F_{12}$ | | 773.8 | 18.37 | 4.14 | 175.6 | 180.0 | 12.93 | 38.97 |
| 2 | $F_{21}$ | $f_1$ | 1321 | 19.79 | 8.08 | 178.4 | 180.0 | 23.31 | 72.40 |
|   |         | $f_2$ | "    | 9.90  | 8.66 | 177.6 | 180.0 | 24.59 | 72.12 |
|   | $F_{22}$ | $f_1$ | 1280 | 24.13 | 7.44 | 176.8 | 180.0 | 21.83 | 66.34 |
|   |         | $f_2$ | "    | 10.47 | 8.10 | 176.9 | 180.0 | 23.76 | 66.26 |
|   | $F_{23}$ | $f_1$ | 1200 | 23.70 | 6.99 | 175.3 | 180.0 | 20.13 | 57.54 |
|   |         | $f_2$ | "    | 7.47  | 7.67 | 177.1 | 180.0 | 22.26 | 59.20 |
|   | $F_{24}$ | $f_1$ | 1078 | 16.35 | 6.37 | 176.6 | 180.0 | 18.41 | 51.35 |
|   |         | $f_2$ | "    | 8.54  | 6.73 | 176.7 | 180.0 | 18.69 | 57.90 |
|   | $F_{25}$ | $f_1$ | 1000 | 17.72 | 5.43 | 177.4 | 180.5 | 17.04 | 49.17 |
|   |         | $f_2$ | "    | "     | "    | "     | "     | "     | "     |
|   | $F_{26}$ | $f_1$ | 915  | 19.51 | 4.89 | 177.0 | 180.0 | 15.75 | 46.42 |
|   |         | $f_2$ | "    | 3.21  | 5.50 | 178.4 | 180.0 | 16.84 | 51.85 |
|   | $F_{27}$ | $f_1$ | 834  | 19.10 | 4.56 | 176.0 | 180.0 | 14.14 | 42.41 |
|   |         | $f_2$ | "    | 9.58  | 4.98 | 175.0 | 180.0 | 14.74 | 43.96 |

In $F_{21}$ to $F_{27}$, j = 1 to 7
$F_{2j}f_1$: AIR/$Q_{11}$, $n_1$–$ik_1$, $d_1$/$Q_{13}$, $n_2$–$ik_2$, $d_2$/$n_5$
$F_{2j}f_2$: AIR/$Q_{13}$, $n_2$–$ik_2$, $d_2$/$Q_{11}$, $n_1$–$ik_1$, $d_1$/$n_5$

TABLE 2

| Number of Layers | Basic Structure | Substituted Film | Overall Film Thickness Å | 193(nm) RR % | T & | PS ° | PS0 ° | 248 (nm) T % | 365 (nm) T % |
|---|---|---|---|---|---|---|---|---|---|
| 1 | $F_{11}$ | $f_1$ | 774  | 18.37 | 4.14  | 175.6 | 180.0 | 12.92 | 38.96 |
|   | $F_{12}$ | $f_1$ | 1062 | 12.65 | 3.67  | 177.3 | 180.1 | 12.04 | 31.88 |
|   | $F_{13}$ | $f_1$ | 1403 | 8.33  | 10.56 | 178.8 | 180.0 | 27.81 | 86.51 |
| 2 | $F_{21}$ | $f_1$ | 950  | 19.44 | 3.74  | 175.7 | 180.0 | 11.96 | 33.38 |
|   |         | $f_2$ | "    | 12.21 | 3.91  | 176.0 | 180.0 | 12.21 | 34.36 |
|   | $F_{22}$ | $f_1$ | 1275 | 12.51 | 7.02  | 177.4 | 180.0 | 20.10 | 54.32 |
|   |         | $f_2$ | "    | 7.40  | 7.23  | 178.5 | 180.1 | 21.01 | 55.17 |
|   | $F_{23}$ | $f_1$ | 1159 | 20.57 | 6.90  | 175.5 | 180.0 | 19.58 | 54.74 |
|   |         | $f_2$ | "    | 5.64  | 7.57  | 177.2 | 180.0 | 21.13 | 57.90 |
| 3 | $F_{31}$ | $f_1$ | 1095 | 19.15 | 5.78  | 176.5 | 180.0 | 17.36 | 49.45 |
|   |         | $f_2$ | "    | 9.51  | 6.19  | 177.0 | 180.0 | 18.20 | 50.49 |
|   |         | $f_3$ | "    | 20.12 | 5.65  | 175.2 | 180.0 | 16.89 | 40.39 |
|   |         | $f_4$ | "    | 11.65 | 6.08  | 177.1 | 180.0 | 17.75 | 56.70 |
|   |         | $f_5$ | "    | 12.97 | 5.87  | 175.8 | 180.0 | 17.04 | 42.26 |
|   |         | $f_6$ | "    | 8.19  | 6.20  | 177.0 | 180.0 | 17.81 | 55.01 |
|   | $F_{32}$ | $f_1$ | 1144 | 20.75 | 5.61  | 177.1 | 180.0 | 17.51 | 50.11 |
|   |         | $f_2$ | "    | 9.18  | 6.10  | 177.9 | 180.0 | 18.39 | 51.25 |
|   |         | $f_3$ | "    | 24.08 | 5.33  | 175.6 | 180.0 | 16.94 | 41.27 |
|   |         | $f_4$ | "    | 11.23 | 6.05  | 177.2 | 180.0 | 17.92 | 55.95 |
|   |         | $f_5$ | "    | 13.94 | 5.66  | 175.6 | L80.0 | 17.6L | 41.16 |
|   |         | $f_6$ | "    | 8.27  | 6.09  | 177.4 | 180.0 | 18.16 | 53.95 |

TABLE 2-continued

| Number of Layers | Basic Structure | Substituted Film | Overall Film Thickness Å | 193(nm) RR % | T & | PS ° | PS0 ° | 248 (nm) T % | 365 (nm) T % |
|---|---|---|---|---|---|---|---|---|---|
| 3 | $F_{33}$ | $f_1$ | 1193 | 16.90 | 5.78 | 178.4 | 180.0 | 18.01 | 50.99 |
|   |   | $f_2$ | " | 11.05 | 6.08 | 178.4 | 180.0 | 18.52 | 51.58 |
|   |   | $f_3$ | " | 18.25 | 5.52 | 178.4 | 180.0 | 17.62 | 46.07 |
|   |   | $f_4$ | " | 9.76 | 6.18 | 177.8 | 180.0 | 18.34 | 54.82 |
|   |   | $f_5$ | " | 13.37 | 5.75 | 176.9 | 180.0 | 18.02 | 44.82 |
|   |   | $f_6$ | " | 8.39 | 6.15 | 178.0 | 180.0 | 18.49 | 53.52 |
|   | $F_{34}$ | $f_1$ | 1258 | 19.13 | 6.99 | 177.3 | 180.0 | 20.32 | 57.26 |
|   |   | $f_2$ | " | 15.00 | 7.46 | 176.4 | 180.1 | 20.82 | 57.26 |
|   |   | $f_3$ | " | 21.07 | 6.50 | 177.3 | 180.0 | 19.79 | 55.38 |
|   |   | $f_4$ | " | 7.27 | 7.72 | 178.5 | 180.0 | 22.25 | 58.44 |
|   |   | $f_5$ | " | 18.08 | 6.62 | 176.1 | 180.1 | 19.70 | 55.10 |
|   |   | $f_6$ | " | 9.04 | 7.45 | 178.0 | 180.0 | 22.10 | 57.77 |

TABLE 3

$\gamma = 193$ nm

| | | $d_j°$ | | | | Film Structure (Three-Layered Film) | | | | |
|---|---|---|---|---|---|---|---|---|---|---|
| j | $Q_j$ | Å | $n_j$ | $k_j$ | $f_1$ | $f_2$ | $f_3$ | $f_4$ | $f_5$ | $f_6$ |
| 1 | 11 | 774 | 2.247 | 0.5882 | $Q_1, n_1, d_1$ | $Q_1, n_2, d_2$ | $Q_1, n_1, d_1$ | $Q_3, n_3, d_3$ | $Q_2, n_2, d_2$ | $Q_3, n_3, d_3$ |
| 2 | 25 | 1062 | 1.909 | 0.4564 | $Q_2, n_2, d_2$ | $Q_1, n_1, d_1$ | $Q_3, n_3, d_3$ | $Q_1, n_1, d_1$ | $Q_3, n_3, d_3$ | $Q_2, n_2, d_2$ |
| 3 | 13 | 1403 | 1.688 | 0.2333 | $Q_3, n_3, d_3$ | $Q_3, n_3, d_3$ | $Q_2, n_2, d_2$ | $Q_2, n_2, d_2$ | $Q_1, n_1, d_1$ | $Q_1, n_1, d_1$ |

| j | n 0 | 1 | 2 | n 0 | 1 | 2 | n 0 | 1 | 2 | n 0 | 1 | 2 | n 0 | 1 | 2 | n 0 | 1 | 2 |
|---|---|---|---|---|---|---|---|---|---|---|---|---|---|---|---|---|---|---|
| 1 | | | | | $n_1$ | | | $n_2$ | | | $n_1$ | | | $n_3$ | | | $n_2$ | $n_3$ |
| 2 | | $n_2$ | | | $n_1$ | | | $n_3$ | | | $n_1$ | | | $n_3$ | | | $n_2$ | |
| 3 | | $n_3$ | | | $n_3$ | | | $n_2$ | | | $n_2$ | | | $n_1$ | | | $n_1$ | |

Examples of Film Structures:
$f_1$: AIR, $n_0/Q_1$, $n_1$-$ik_1$, $d_1/Q_2$, $n_2$-$ik_2$, $d_2/Q_3$, $n_3$-$ik_3$/SUBSTRATE, $n_3$
$f_2$: AIR, $n_0/Q_2$, $n_2$-$ik_2$, $d_2/Q_1$, $n_1$-$ik_1$, $d_1/Q_3$, $n_3$$ik_3$/SUBSTRATE, $n_3$
.
.
.
$f_6$: AIR, $n_0/Q_3$, $n_3$-$ik_3$, $d_3/Q_2$, $n_2$-$ik_2$, $d_2/Q_1$, $n_1$-$ik_1$, $d_1$/SUBSTRATE, $n_3$

TABLE 4

MoSiON Sputter Film (annealed at 350° C. for 3 hours)

| | Ar | $N_2O$ | Ar | $N_2O$ | Wavelength (nm) | | | | | |
|---|---|---|---|---|---|---|---|---|---|---|
| | | | | | 193 | | 248 | | 365 | |
| Q | SCCM | SCCM | Vol % | Vol % | n | k | n | k | n | k |
| 11 | 12 | 20 | 37.5 | 62.5 | 2.247 | 0.5882 | 2.147 | 0.4628 | 2.164 | 0.2996 |
| 12 | 12 | 25 | 32.43 | 67.57 | 2.134 | 0.4952 | 2.044 | 0.3916 | 2.038 | 0.2860 |
| 25 | 12 | 30 | 28.57 | 71.43 | 1.909 | 0.4564 | 1.969 | 0.3643 | 1.999 | 0.2648 |
| 13 | 12 | 40 | 23.08 | 76.92 | 1.688 | 0.2333 | 1.745 | 0.1648 | 1.663 | 0.00737 |

Embodiment 2 (Production of Phase-Shift Photo Mask Blank)

A molybdenum silicide oxy-nitride film was formed on a transparent substrate using a planar DC magnetron sputtering apparatus according to the so-called LTS (Long Throw Sputtering) technique such as those disclosed and used in Japanese Un-Examined Patent Publication Nos. Hei 6-220627 and Hei 8-127870 and N. Motegi, Y. Kashimoto, K. Nagatani et al., J. Vacuum Sci. Technol., 1995, Vol. B13 (4), pp. 1906–1909, the disclosure of which is incorporated by reference herein. More specifically, an MoSiON film was deposited on a 6025 quartz substrate having a size of 6 in (152.4 mm) square and a thickness of 0.25 in (6.35 mm) according to the reactive sputtering in which an $MoSi_2$ target is placed within the apparatus and which makes use of Ar gas and $N_2O$ gas in flow rates and a ratio of flow rate specified in Table 4, at a pressure ranging from 0.0533 to 0.107 Pa ($4\sim8\times10^{-4}$ Torr). After the completion of the film deposition, the deposited films were heat-treated at 350° C. for 3 hours to give phase-shift photo mask blanks comprising double-layered and three-layered MoSiON films as phase-shift films.

Figure 6:
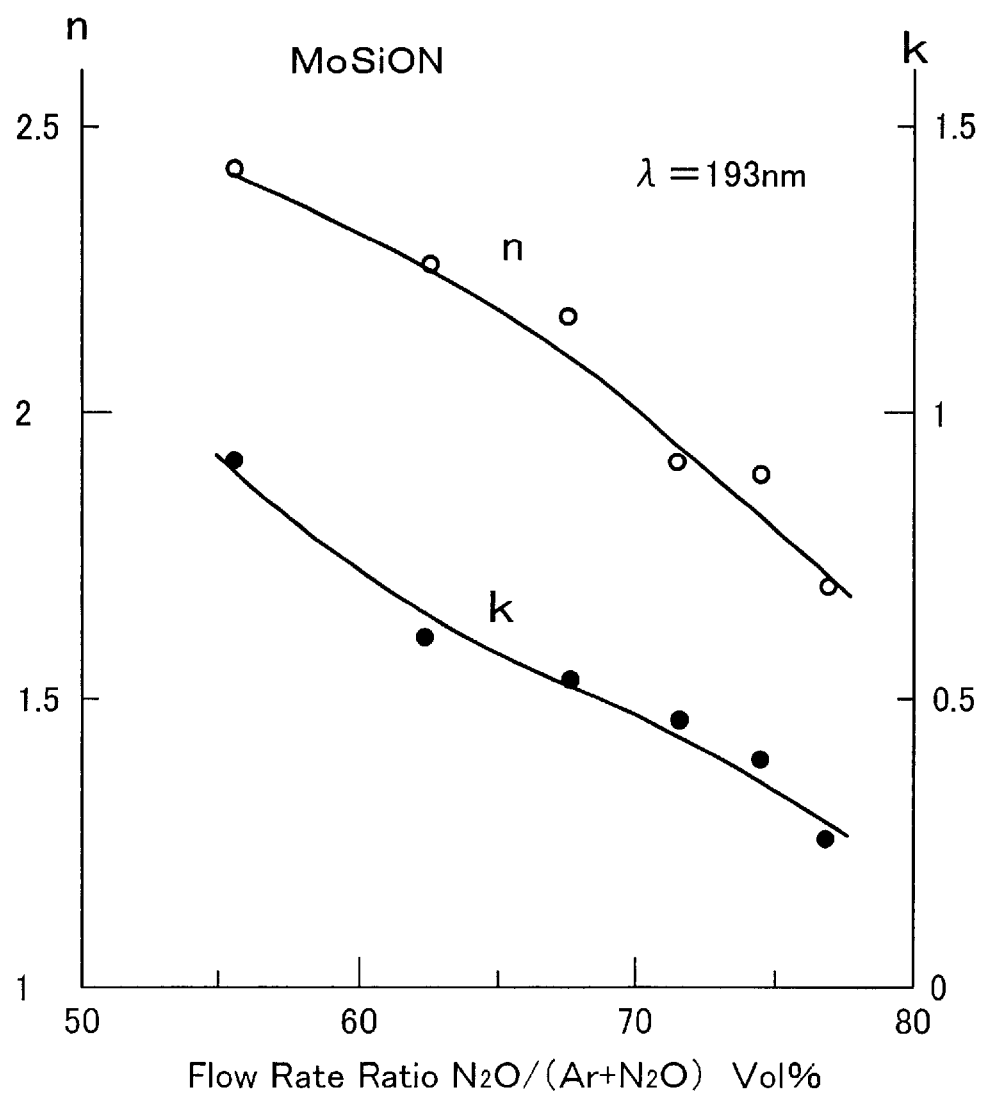
FIG. 6 is a graph showing the relation between the ratio of the reactive gas flow rate ($N_2O/(Ar+N_2O)$, vol %) used in the reactive sputtering step and optical constants (refractive index n and extinction coefficient k).

Each resulting film has a structure according to the present invention as shown in Table 1 or 2. The relation between the reactive gas flow ratio ($N_2O/(Ar+N_2O)$, vol %) and the optical constants observed for the MoSiON type sputter films thus produced are listed in Table 4 and shown in FIG. 6. As will be seen from the data listed or shown in Table 4 and FIG. 6, the higher the reactive gas flow ratio, the smaller the refractive index n and the extinction coefficient k. In other words, the higher the degree of the oxy-nitriding of the MoSiON film, the smaller the refractive index n and the extinction coefficient k.

The same tendency would be observed when MoSiN type and MoSiO type sputter films are substituted for the MoSiON type sputter film as the phase-shift film.

Embodiment 3 (Production of Phase-Shift Photo Mask)

A resist for electron beams (such as ZEP-810S available from Nippon Zeon Co., Ltd.) was applied onto the phase-shift photo mask blank produced in Embodiment 2 to form a resist film having a thickness of about 5000 Å. Then the resist film was subjected to a series of well-known pattern-forming procedures such as pattern-exposure, development, dry etching and washing to remove a part of the phase-shift film through etching and to thus form a phase-shift photo mask on which a pattern was formed by holes or dots or which comprised holes and the phase-shift film. In this connection, the dry etching step was performed using a parallel plate RF ion etching device in which a distance between electrodes was set at 60 mm, and a working pressure was set at 40 Pa (0.3 Torr), using a mixed gas ($CF_4+O_2$; the flow rates thereof were about 95% by volume and 5% by volume, respectively). Thus, a photo mask having a fine pattern could be produced.

Embodiment 4 (Fabrication of Semiconductor Device)

A wafer to which a photoresist film had been applied was exposed to an ArF excimer laser beam through the phase-shift photo mask produced in Embodiment 3 to thus transfer a desired pattern of the photo mask onto the wafer substrate. Then the exposed photoresist film was removed through development to form the desired pattern on the wafer. Thereafter, the wafer was treated according to the usual semiconductor device-manufacturing processes to give a semiconductor device. The semiconductor device thus fabricated had a fine pattern.

As has been discussed above in detail, the attenuation type (half tone) phase-shift film according to the present invention is designed such that it has a double-layered structure and the refractive index of the upper layer of the film is smaller than that of the lower layer thereof. Therefore, the phase-shift photo mask prepared from the film has a high transmittance at an exposure wavelength and a low reflectance.

According to the present invention, the attenuation type phase-shift film is also designed such that it has a three-layered structure and the refractive index of the intermediate layer of the film is smaller than those observed for the upper and lower layers thereof. For this reason, the resulting phase-shift photo mask has a low transmittance at the defect-inspection wavelength and thus the mask can be inspected for the presence of any defect.

Moreover, according to the present invention, the phase-shift film is likewise designed in such a manner that it has a multi-layered structure comprising at least 3 layers and that the refractive index of the upper most layer of the film is smaller than that observed for the layer immediately below the upper most layer. Therefore, the phase-shift photo mask produced from the film has a high transmittance at an exposure wavelength and a low reflectance.

In addition, the phase-shift photo mask blank according to the present invention is quite useful for producing a phase-shift photo mask to be exposed to an ArF excimer laser beam. The resulting photo mask permits the fabrication of a semiconductor device having a quite fine pattern.

What is claimed is:

1. A phase-shift photo mask blank comprising a half-tone phase-shift film, wherein the half-tone phase-shift film has a phase difference (Ps) of from 170 to 190 degrees at an exposure wavelength of $\lambda_{exp}$, a transmittance for $T_{exp}$ of from 2 to 30% at an exposure wavelength of $\lambda_{exp}$, and a transmittance for $T_{insp}$ of $\leq 50\%$ at an inspection wavelength of $\lambda_{insp}$, wherein the half-tone phase-shift film consists of two layers and refractive index of an upper layer of the film is smaller than that of a lower layer thereof.

2. The phase-shift photo mask blank according to any of claim 1, wherein the half tone phase-shift film is an MoSiON type film.

3. A phase-shift photo mask comprising the phase-shift photo mask blank according to claim 1, on which a pattern to be transferred to a wafer substrate is formed.

4. A method of manufacturing a semiconductor device, comprising the step of exposing a wafer substrate to light rays through the phase-shift photo mask according to claim 3 to form a semiconductor device having a fine pattern.

5. A phase-shift photo mask blank, comprising a half-tone phase-shift film, wherein the half-tone phase-shift film has a phase difference (Ps) of from 170 to 190 degrees at an exposure wavelength of $\lambda_{exp}$, a transmittance for $T_{exp}$ of from 2 to 30% at an exposure wavelength of $\lambda_{exp}$, and a transmittance for $T_{insp}$ of $\leq 50\%$ at an inspection wavelength of $\lambda_{insp}$, wherein the half-tone phase-shift film consists of three layers and refractive index of an intermediate layer of the film is smaller than that for an upper and a lower layer thereof.

6. The phase-shift photo mask blank according to claim 5, wherein the half tone phase-shift film is an MoSiON type film.

7. A phase-shift photo mask comprising the phase-shift photo mask blank according to claim 5, on which a pattern to be transferred to a wafer substrate is formed.

8. A method of manufacturing a semiconductor device, comprising the step of exposing a wafer substrate to light rays through the phase-shift photo mask according to claim 7 to form a semiconductor device having a fine pattern.

9. A phase-shift photo mask blank comprising a half-tone phase-shift film, wherein the half-tone phase-shift film has a phase difference (Ps) of from 170 to 190 degrees at an exposure wavelength of $\lambda_{exp}$, a transmittance for $T_{exp}$ of from 2 to 30% at an exposure wavelength of $\lambda_{exp}$, and a transmittance for $T_{insp}$ of $\leq 50\%$ at an inspection wavelength of $\lambda_{insp}$, wherein the half-tone phase-shift film consists of three layers and refractive index of an upper layer of the film is smaller than that of an intermediate layer thereof.

10. The phase-shift photo mask blank according to claim 9, wherein the half tone phase-shift film is an MoSiON type film.

11. A phase-shift photo mask comprising the phase-shift photo mask blank according to claim 9, on which a pattern to be transferred to a wafer substrate is formed.

12. A method of manufacturing a semiconductor device, comprising the step of exposing a wafer substrate to light rays through the phase-shift photo mask according to claim 11 to form a semiconductor device having a fine pattern.

13. A phase-shift photo mask blank comprising a half-tone phase-shift film,
   wherein the half-tone phase-shift film has a phase difference (Ps) of from 170 to 190 degrees at an exposure wavelength of $\lambda_{exp}$, a transmittance for $T_{exp}$ of from 2 to 30% at an exposure wavelength of $\lambda_{exp}$, and a transmittance for $T_{insp}$ of $\leq 50\%$ at an inspection wavelength of $\lambda_{insp}$,
   wherein the half-tone phase-shift film consists of at least four layers and refractive index of an upper most layer of the film is smaller than that of a layer immediately below the upper most layer.

14. The phase-shift photo mask blank according to claim 13, wherein the half tone phase-shift film is an MoSiON type film.

15. A phase-shift photo mask comprising the phase-shift photo mask blank according to claim 13, on which a pattern to be transferred to a wafer substrate is formed.

16. A method of manufacturing a semiconductor device, comprising the step of exposing a wafer substrate to light rays through the phase-shift photo mask according to claim 15 to form a semiconductor device having a fine pattern.

17. A method of manufacturing a semiconductor device, comprising the step of exposing a wafer substrate to light rays through a phase-shift photo mask comprising a phase-shift photo mask blank selected from the group consisting of a double-layered half tone phase-shift film in which refractive index of an upper layer of the film is smaller than that of a lower layer thereof, a three-layered half tone phase-shift film in which refractive index of an intermediate layer thereof is smaller than those of upper and lower layers thereof or refractive index of an upper layer of the film is smaller than that of an intermediate layer thereof, or a multi-layered half tone phase-shift film comprising at least four layers in which refractive index of an upper most layer of the film is smaller than that of a layer immediately below the upper most layer, on which a pattern to be transferred to the wafer substrate is formed to fabricate a semiconductor device having a fine pattern,
   wherein the half-tone phase-shift film has a phase difference (Ps) of from 170 to 190 degrees at an exposure wavelength of $\lambda_{exp}$, a transmittance for $T_{exp}$ of from 2 to 30% at an exposure wavelength of $\lambda_{exp}$, and a transmittance for $T_{insp}$ of $\leq 50\%$ at an inspection wavelength of $\lambda_{insp}$.

* * * * *